(12) United States Patent
Daneels

(10) Patent No.: US 11,532,994 B2
(45) Date of Patent: Dec. 20, 2022

(54) ELECTRICAL ENERGY STORAGE DEVICE AND METHOD FOR PRODUCING AN ELECTRICAL ENERGY STORAGE DEVICE

(71) Applicant: Rogers BVBA, Ghent (BE)

(72) Inventor: Jan Daneels, De Pinte (BE)

(73) Assignee: ROGERS BV, Evergem (BE)

( * ) Notice: Subject to any disclaimer, the term of this patent is extended or adjusted under 35 U.S.C. 154(b) by 125 days.

(21) Appl. No.: 16/546,524

(22) Filed: Aug. 21, 2019

(65) Prior Publication Data

US 2020/0067418 A1 Feb. 27, 2020

(30) Foreign Application Priority Data

Aug. 24, 2018 (EP) ..................... 18190639

(51) Int. Cl.
*H02M 7/00* (2006.01)
*H01G 2/10* (2006.01)
*H01G 4/018* (2006.01)
*H01G 4/224* (2006.01)
*H01M 10/667* (2014.01)
*H01M 10/42* (2006.01)

(52) U.S. Cl.
CPC .............. *H02M 7/003* (2013.01); *H01G 2/10* (2013.01); *H01G 4/018* (2013.01); *H01G 4/224* (2013.01); *H01M 10/4264* (2013.01); *H01M 10/667* (2015.04)

(58) Field of Classification Search
CPC ......... H02M 7/003; H01G 2/10; H01G 4/018; H01G 4/224; H01M 10/667; H01M 10/4264
See application file for complete search history.

(56) References Cited

U.S. PATENT DOCUMENTS

| | | | | |
|---|---|---|---|---|
| 5,142,439 A | * | 8/1992 | Huggett | H02M 7/003 361/321.2 |
| 2002/0190388 A1 | * | 12/2002 | Eytcheson | H01L 24/31 438/618 |
| 2003/0117763 A1 | * | 6/2003 | Connolly | H01G 4/232 361/301.5 |
| 2010/0008018 A1 | * | 1/2010 | Korich | H01G 2/04 361/306.1 |
| 2014/0036411 A1 | * | 2/2014 | Dillmann | H01G 4/385 361/434 |
| 2016/0268921 A1 | | 9/2016 | Feuerstack | |
| 2016/0308218 A1 | * | 10/2016 | Ota | H01M 4/661 |
| 2017/0338040 A1 | | 11/2017 | Kessler | |

FOREIGN PATENT DOCUMENTS

| | | |
|---|---|---|
| DE | 10057140 A1 | 6/2002 |
| EP | 2511922 B1 | 9/2013 |

* cited by examiner

*Primary Examiner* — Michael P McFadden
(74) *Attorney, Agent, or Firm* — Cantor Colburn LLP

(57) ABSTRACT

Electrical energy storage device (1), including at least one electrical component (2) and a busbar (5) for electrical power distribution, where the electrical component (2) is arranged on the busbar (5), and at least a first contact side (11) and/or a second contact side (12) of the electrical component (2) is connected to the busbar (5) by a contact element (8), and wherein the contact element (8) is formed at least partially as a mesh (7). The electrical component (2) is preferably a capacitor.

15 Claims, 5 Drawing Sheets

ELECTRICAL ENERGY STORAGE DEVICE AND METHOD FOR PRODUCING AN ELECTRICAL ENERGY STORAGE DEVICE

CROSS REFERENCE TO RELATED APPLICATIONS

This application claims the benefit of EP Application No. 18190639.7, filed Aug. 24, 2018, the contents of which are incorporated herein by reference in their entirety.

BACKGROUND

The present invention describes an electrical energy storage device and a method for producing an electrical energy storage device.

Electrical energy storage devices are well known in the prior art. Typically, several electrical components such as capacitors are included in such an electrical energy storage device for forming a capacitor bar. In particular, these capacitors are connected in parallel and/or in series for realizing a desired total capacity of the electrical energy storage device. Usually, the electrical power distribution of the capacitors is handled by a busbar.

These electrical energy storage devices are exposed to considerable temperature variations. Typically, repeatedly turning the electrical components on and off results in a self-heating of the electrical components. Another reason for temperature variations might be cyclic environment changes, such as temperature variations from day to night. These temperature variations result in thermal fatigue and lead to potential failures after many thermal cycles. In particular, there is a risk that a connection between the busbar and the electrical component is weakened and might even lead to an open circuit.

SUMMARY

It is therefore an object of the present invention to provide an electrical energy storage device being improved in comparison to those known in the state of the art, in particular with respect to their lifetime and in particular carrying capacitors. This object is achieved by an electrical energy storage device according to claim 1, by an electrical energy storage device according to claim 14 and by a method for producing an electrical energy storage device according to claim 15. According to a first aspect of the present invention an electrical energy storage device, is provided, comprising
  at least one electrical component, especially an electrical energy storage capacitor and
  a busbar, in particular a laminated and/or flat busbar, for electrical power distribution,
  wherein at least one first contact side and/or at least one second contact side of the electrical component is connected to the busbar by a contact element, in particular a flat contact element, and wherein the contact element is formed at least partially as a mesh.

DETAILED DESCRIPTION

Figure 1A:
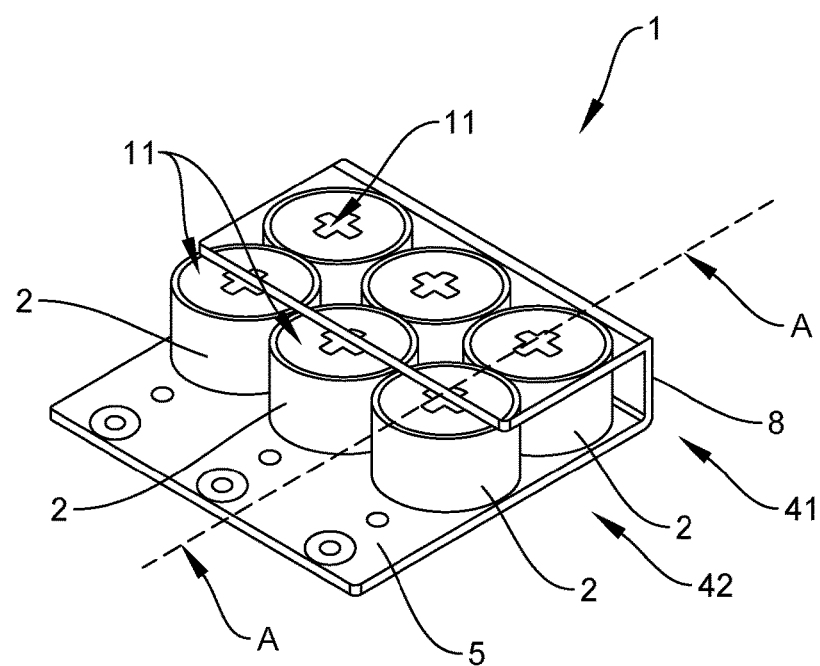
FIGS. 1a and 1b schematically shows an electrical energy storage device according to a first embodiment of the present invention,
FIG. 2 schematically shows a mesh used as at least as part of the contact element for an electrical storage device according to the present invention.

In contrast to the state of the art, it is provided according to the present invention to use a contact element being at least partially formed as a mesh. In an advantageous manner, the mesh absorbs mechanical stress caused by small relative rearrangements of the electrical component s and/or the busbar as a result of the temperature variations. Thus, the connection between the busbar and the electrical component is more resistant to stress caused by temperature variations, in particular temperature variations expected in an application of the energy storage device. Preferably, the contact element is formed as a mesh in a connection region in which the contact element is fixed to the busbar and/or the first contact side or second contact side of the electrical component. It is conceivable that the electrical components are arranged on the busbar or next to the busbar. For example, the busbar extends parallel, slanted and/or perpendicular to a plane comprising the first contact side and/or the second contact side. Further, it is provided that the contact element connects a plurality of electrical component to each other and to the busbar. By using a mesh, it is easily possible to adapt the alignment of the contact element by deforming or bending the mesh correspondingly, for example when there are small intolerances in the arrangement of the electrical components, when the electrical components have different sizes or dimensions and/or when the contact element surrounds the electrical components. According to a preferred embodiment, the electrical component is a capacitor, a battery cell or a semiconductor. Hereinafter, capacitors are used as the preferred electrical component, but any other electrical storage element can also be used for the embodiments described herein below.

For example, the first contact side is represented by a positive pole of the electrical component and the second contact side is represented by a negative pole of the electrical component or vice versa. Preferably, the first contact side and/or the second contact side are arranged at front ends of the electrical component, in particular at opposite front ends of the electrical component. The electrical components might have a cylindrical shape, wherein the cross section might be circular, rectangular and/or elliptical. Preferably, the busbar comprises at least one flat conductive layer made from metal. Thus, the busbar can be deformed easily and adapted to the requirements of a space provided for the energy storage device. As a consequence, it is possible to insert the energy storage device having such a busbar in a flexible way into different formed spaces. In particular, the term flat, in the context of the busbar as well as in the context of the contact element, means that a corresponding base body has a thickness being less than 10 times, preferably 15 times and more preferably 20 time smaller than an extension of the base body in a plane perpendicular to the direction for measuring the thickness. Furthermore, the term "flat" includes such base bodies that are bended or deformed, but are in general flat. Furthermore, it is provided that the first contact side and/or the second contact side are configured flatly, for providing a large potential contact region.

Preferably, the contact element surrounds the electrical component at least partially and/or is bended. By bending the contact elements it is advantageously possible to realize the electrical connection to the busbar, independent on the relative orientation of the busbar and the first contact side/ second contact side. Actually, it is even possible to connect the first contact side and the second contact side being arranged opposite to each other at the electrical component to the same busbar located adjacent to the first contact side and/or the second contact side.

In another preferred embodiment, it is provided that the mesh is configured as a plain weave like structure. Forming a plain weave structure results in an improved ability for absorbing mechanical stress. Furthermore, it is provided that a ratio between a part forming the mesh to the whole contact element has a value between 0.2 and 0.8, preferably 0.3 and 0.8 and more preferably between 0.4 and 0.75.

According to another embodiment of the present invention it is provided that the mesh is made from first wires and/or second wires, wherein the first wires extend parallel to each other and the second wires extend parallel to each other, wherein the first wires and the second wires cross each other at crossing points, wherein an angle between the first wires and the second wires in the crossing point has a value between 40° to 120°, preferably 75° to 110° or more preferably mainly 90°.

Depending on the relative orientation between the first wires and the second wires it is possible to realize a preferred direction for absorbing the mechanical stress. As a consequence, it is advantageously possible to adapt the orientation of the mesh formed from the first wires and second wires depending on the expected extension of the first contact side, the second contact side and/or the busbar, for example, when the first contact side and the second contact side have a non-circular cross section. It is also conceivable that the orientation of the mesh formed by the first wires and the second wires is adjusted depending on a direction from which the contact elements extends to the first contact side and/or second contact side for connecting. Preferably, an angle between the first wires and the second wires in the crossing point has a value between 25° to 70°, preferably 35° to 55° or more preferably mainly 45°.

Furthermore, it is provided that the contact element is adhesively connected to the first contact side, the second contact side and/or the busbar for example by soldering and/or welding. For example the contact element is connected to the first contact side, the second contact side and/or the busbar via several connection regions being distributed along the first contact side, the busbar and/or the second contact side. In particular, the connection region or a sum of several connection regions is smaller, preferably 4 times smaller and more preferably 10 times smaller than an extension of the first contact side and/or second contact side. Preferably, several connection regions are distributed statistically along the first front side or are distributed according to a predefined pattern, in particular a pattern for an optimized absorption of mechanical stress.

In another preferred embodiment of the present invention, it is provided that the mesh is made from first wires and/or second wires having a thickness between 0.1 and 1 mm, preferably between 0.2 and 0.8 mm and more preferably between 0.25 and 0.65 mm. Thus, comparable thin first wires and/or second wires are used and therefore the mesh can easily be adapted to a desired form, for example by bending. Preferably, the connection region extends over several first and/or second wires.

Preferably, it is provided that a width assigned to an open area of the mesh has a value between 0.5 mm and 2.0 mm, preferably between 0.65 and 1.5 mm and more preferably between 0.8 and 1.35 mm. Thus, it is possible to realize comparable large open areas that preferably are larger than the thickness of the first and/or second wires. It has shown surprisingly that such a mesh can realize a sufficient electrical connection to the first contact side, the second contact side and/or the busbar as well as a desired ability for absorbing mechanical stress caused by usual temperature derivations. Preferably, the open area is surrounded by first wires and second wires and the width is measured between two adjacent first wires or two adjacent second wires.

In another embodiment it is provided that the contact element contacts several first contact sides and/or several second contact sides of different electrical components to the busbar, i. e. the contact element establishes the connection between the first contact sides and/or several second contact sides of different electrical components with each other as well as with the busbar. Preferably, the first contact sides and/or the second contact sides are arranged parallel to each other or share a common plane. Alternatively, it is conceivable that the first contact sides and/or the second contact sides are arranged in different planes, for example at different heights. Thus, it might possible to connect several electrical components having different heights (i. e. different length measured along their longitudinal direction), for example by bending the contact element in a region between the electrical components. Preferably, it is provided that the mesh is at least realized in a region connecting the contact element to the first contact sides and/or second contact sides and a region between the first contact sides and/or the second contact sides. Preferably, the first contact sides and/or the second contact sides of the electrical components are located at the front ends of each electrical component and the first contact sides and/or the second contact sides form a plane for being connected with each other with the flat contact element.

Preferably, the complete contact element is formed as mesh or
- a bended region is formed as mesh and/or
- a region of the contact element connected to the first contact side and/or the second contact side is formed as mesh. Realizing the contact element fully as mesh allows easily producing an energy storage device having a comparable low weight. By forming parts of the mesh as fully closed areas it is possible to strengthen or reinforce selected area of the contact element locally.

According to another embodiment of the invention, it is provided that the busbar is at least partially covered by an isolation layer and wherein preferably the electrical component is directly arranged on the isolation layer. Due to the isolation layer it is advantageously possible to arrange the electrical components directly on the flat or laminated busbar. Thus, the busbar in not only in charge of distributing the electrical power but also the busbar represents a carrier for arranging an assembly of electrical components on it. For example, the first contact side of the electrical component is arranged on the isolation layer and a via through the isolation layer realizes the connection to the conductive layer, in particular to a second conductive layer, wherein the second contact side of the electrical component is connected to the first conductive layer via the contact element extending at least along the length of the electrical components measured along their longitudinal direction.

In particular, it is provided that the busbar comprises a first conductive layer and a second conductive layer, wherein a further isolation layer is arranged between the first conductive layer and the second conductive layer. Thus, a compact busbar can be realized.

According to another embodiment of the present invention it is provided that the mesh is made from copper having a purity being larger than 95%, preferably 99% and more preferably larger than 99.5%. Thus, it is advantageously possible to realize an efficient electrical contact between the contact element and the first contact side, the second contact side and/or the busbar.

In another preferred embodiment it is provided that the contact element, in particular the mesh, is at least partially coated with an additional isolation layer. For example a side of the mesh pointing away from the first contact side, the second contact side and/or the busbar is covered at least partially by the additional isolation layer. In particular, the parts of the contact element that are not part of the connection region have an additional isolation layer. Thus, an undesired electrical contact to an element next to the energy storage device, such as a housing, can be avoided.

Another aspect of the present invention is an electrical energy storage device having several electrical components, wherein first contact sides and/or second contact sides of the electrical components are connected to each other by a contact element, wherein the contact element is formed at least partially as a mesh. All features and benefits disclosed in the context of the electrical storage device having the busbar can be transferred to the electrical storage device connecting several electrical components and vice versa.

A further aspect of the present invention is a method for realizing an electrical storage device according to the invention. All features and benefits disclosed in the context of the electrical storage devices can be transferred to the electrical storage device connecting several electrical components and vice versa.

Wherever not already described explicitly, individual embodiments or their individual aspects and features can be combined or exchanged with one another without limiting or widening the scope of the described invention, whenever such a combination or exchange is meaningful and in the sense of this invention. Advantages which are described with respect to one embodiment of the present invention are, wherever applicable, also advantageous of other embodiments of the present invention.

Figure 1B:
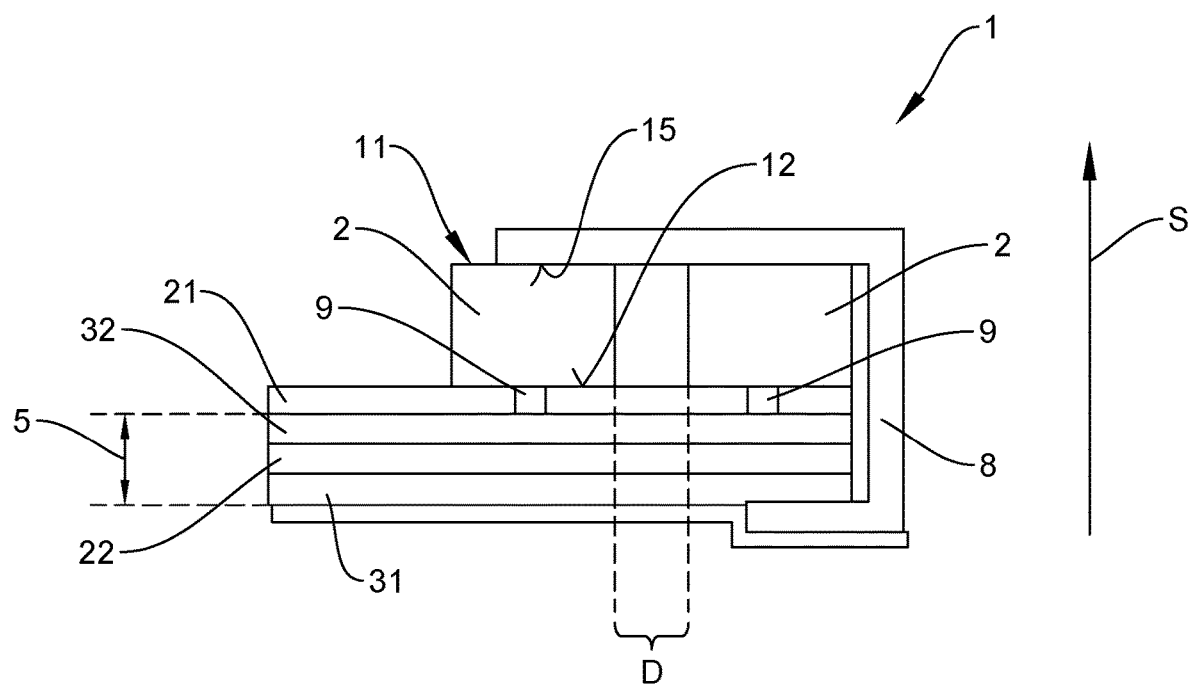

In FIGS. 1a and 1b an electrical energy storage device 1 according to a first embodiment of the present invention is schematically presented in a perspective view (FIG. 1a) and in a cross-sectional view (FIG. 1b) along an A-A line A incorporated into FIG. 1a. In general, the electrical storage device 1 comprises several capacitors 2 being connected to each other for realizing a capacitor bank. For example, the capacitor bank illustrated in FIG. 1 is built up by six capacitors 2 having a capacity of 150 µF/900 Vdc. As a result, the capacitor bank has a total capacity of 900 µF/900 Vdc.

Preferably, at least one or several capacitors 2, in particular all capacitors 2, comprise a metallized film being winded, i. e. such a capacitor 2 is realized by winding the metallized film. Thereby the film is metallized on both sides. By adjusting the number of windings it is advantageously possible to determine a desired capacity of the corresponding capacitor 2. As a result of winding the metalized film the capacitors 2 have a cylindrical shape. Furthermore, it is provided that the capacitor 2 comprises a dielectric having polyethylene terephthalate (PETP), polyethylene naphthalate (PEN), polyphenylene sulphide (PPS), polypropylene (PP), polycarbonate (PC) and/or the like.

Further, the capacitor 2 has a first contact side 11, for example a positive contact or pole, and a second contact side 12, for example a negative contact or pole, wherein the first contact side 11 and the second contact side 12 are usually at opposite ends of the capacitor 2. For example, the first contact side 11 and the second contact side 12 are formed by metals sprayed by tin (Zn) or another metal. The capacitors 2 shown in FIGS. 1a and 1b have a first contact side 11 and a second contact side 12 being arranged at the end faces of the cylindrical shaped body of each capacitor 2.

In particular, it is provided that the capacitors 2 are free from isolation, i. e. the capacitors 2 are so called "naked" capacitors 2. Furthermore, it is provided that the energy storage device 1 comprises a busbar 5. The busbar 5 preferably has a first conductive layer 31 and a second conductive layer 32, wherein the first conductive layer 31 and the second conductive layer 32 are stacked on each other along a stacking direction S. On top of the second conductive layer 32 an isolation layer 21 is arranged and preferably between the first conductive layer 31 and the second conductive layer 32 a further isolation layer 22 is arranged. In particular, the busbar 5 is laminated in order to form the isolation layer 21. For a lower inductance, a higher reliability and an improved cooling behaviour, it is provided that the capacitors 2 are electrically connected to the busbar 5 and are directly arranged on and connected to the busbar 5.

In the embodiment shown in FIG. 1 it is provided that the capacitors 2 are orientated such that the first contact side 11 of each of the capacitors 2 is arranged opposite to the busbar 5, i. e. facing away from the busbar 5, and the second contact side 12 of each of the capacitors 2 faces to the busbar 5. Furthermore, it is preferably provided that a distance D between two capacitors 2, in particular the distance D between capacitors 2 of a first row 41 and capacitors 2 of a second row 42, is between 0.5 mm and 5 mm, preferably between 0.8 mm and 2.5 mm and more preferably between 1.1 mm and 1.5 mm For connecting the second contact side 12 of the capacitors 2 to the second conductive layer 32, an interlayer connection 9 reaching through the isolation layer 21 is provided. For connecting the first contact sides 11 to the first conductive layer 31 a common contact element 8 is provided, wherein the common contact element 8 contacts the first contacts sides 11 of all capacitors 2. Preferably, the contact element 8 is bow-shaped. For example, the contact element 8 is constructed such that the contact element 8 surrounds the arrangement of capacitors 2 and busbar 5 at least on one side, in particular in the region of an edge of the busbar 5, and is directly connected to the first conductive layer 31.

In particular, the contact element 8 is configured at least partially as a mesh 7. Preferably, the whole contact element 8 is formed as a mesh 7 or the contact element 8 is only or partially formed as a mesh 7 in a region that contacts the first contact side 11 and/or the second contact element 12 and/or in a bended region. Using the mesh 7 has a positive effect of absorbing mechanical stress being caused by temperature variations during use of the energy storage device in normal operation. Furthermore it is provided that the first contact side 11 of the capacitor 2 is connected to the contact element in a connection region 15, for example by soldering and/or welding.

Furthermore, it is provided that the arrangement comprising the capacitors 2, the contact element 8 and at least a part of the busbar 5 is arranged in a casing (not shown here). For example the casing is made from metal and/or plastic. It is also possible that the casing is additionally filled with an epoxy, polyurethane and/or the like for fixing the arrangement inside the casing.

Figure 2:
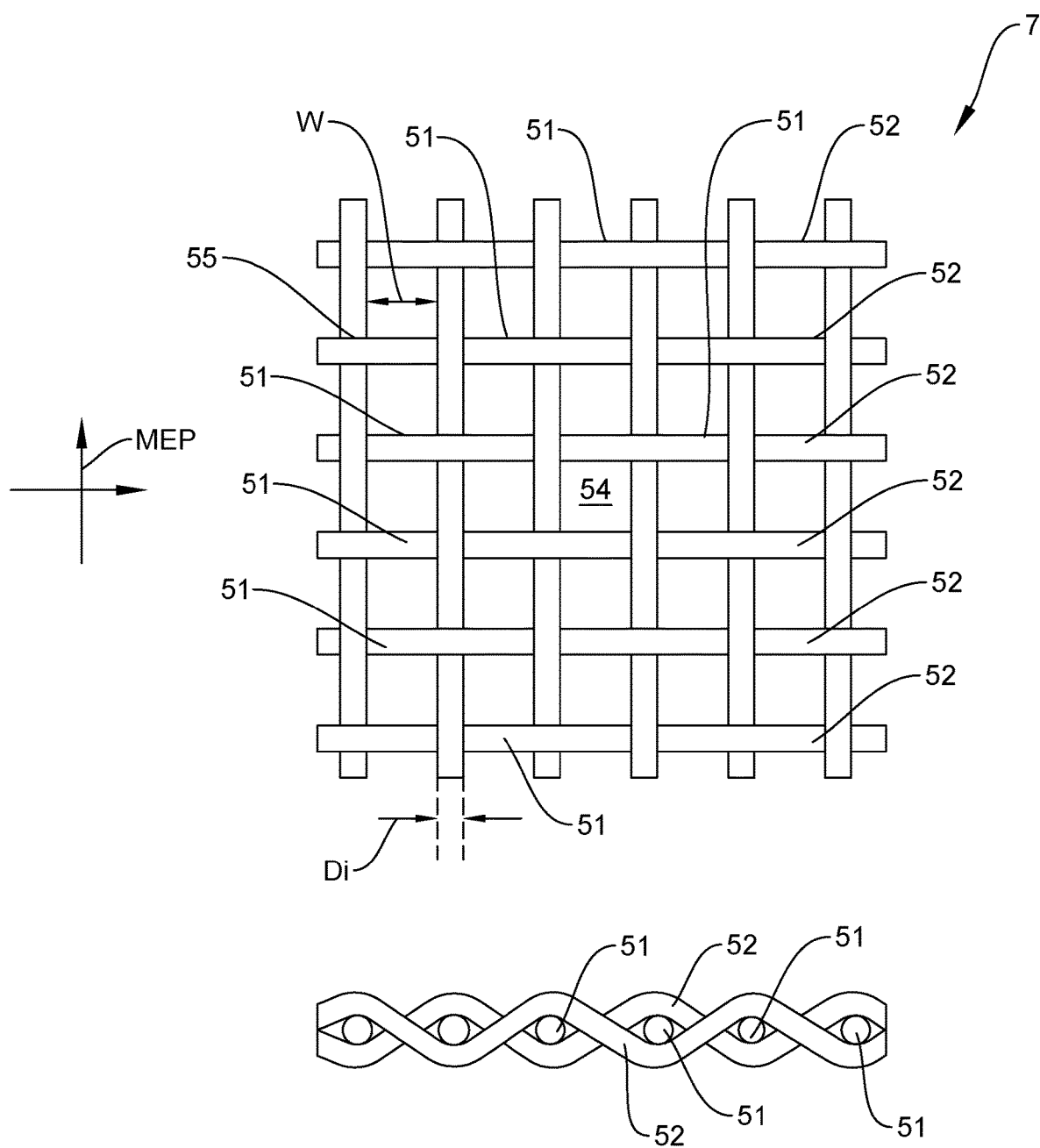

In FIG. 2, a mesh 7 is used at least as part of the contact element 8 for the electrical storage device 1 according to the present invention is shown in a top view illustration (top) and a side view illustration (bottom). In particular, the mesh 7 is configured as a mainly plain weave like mesh 7.

Preferably, the mesh 7 is formed by first wires 51 being arranged parallel to each other, wherein each first wire 51 passes alternately over and under second wires 52 running transversely through the mesh at 5° to 90° degree angles, preferably 45° to 90° degree angles and more preferably mainly at 90° degree relatively to the second wires 52. In particular, it is provided that the mesh 7 extends at least partially in a main extension plain MEP and the first wires 51 and the second wires 52 are arranged above each other in a crossing point 55. In particular, the first wires 51 and the second wires 52 are arranged such that the arrangement order, i. e. whether the first wire 51 is arranged above or under the second wire 52 in a direction perpendicular to the main extension plain MEP, changes from crossing point 55 to crossing point 55 along an extension direction of the first wire 51 and/or second wire 52. Furthermore, it is preferably provided that the first wires 51 and the second wires 52 are connected to each other in the crossing point 55, for example adhesively by welding and/or soldering.

Especially, the mesh 7 is formed by first wires 51 and/or second wires 52 having a diameter Di between 0.1 and 1 mm, preferably between 0.2 and 0.8 mm and more preferably between 0.25 and 0.65 mm. In this context, it is conceivable that the first wires 51 and/or second wires 52 have the same diameter Di or the diameters Di differs from each other. Furthermore, it is provided that the mesh 7 has an open area 54 being defined by the surrounding first wires 51 and second wires 52, wherein a ratio of the open area 54 to the whole contact element 7 has a value between 0.2 and 0.7, preferably between 0.3 and 0.65 and more preferably between 0.4 and 0.6 and/or a width W assigned to the open area 54 has a value between 0.5 mm and 2.0 mm, preferably between 0.65 and 1.5 mm and more preferably between 0.8 and 1.35 mm. Preferably, the width W corresponds to a distance between two adjacent first wires 51 and/or second wires 52. For example, a number of meshes 7 counted per cm is 3 to 13, preferable 4 to 12 and more preferably 6 to 9.

The open area 54 shown in FIG. 2 has a square shape. Alternatively, it is also conceivable that the open area 54 has a circular, triangular, elliptical, rectangular and/or honeycomb like shape. Furthermore, it is provided that the mesh 7 is connected to the first contact side 11 and/or second contact side 12 in a connection region 15 adhesively, for example by welding and/or soldering.

Figure 3A:
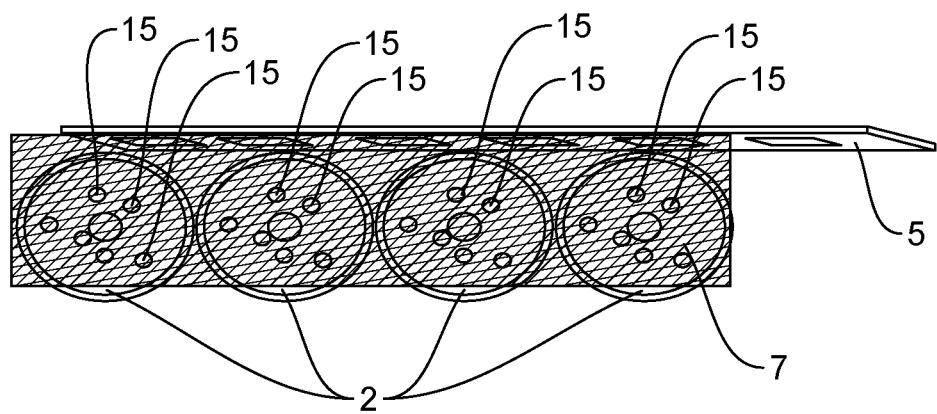
FIGS. 3a and 3b schematically shows an energy storage device according to a second preferred embodiment of the present invention
FIG. 4 schematically shows an energy storage device according to a third preferred embodiment of the present invention and
FIG. 5 schematically shows an energy storage device according to a fourth preferred embodiment of the present invention.
Figure 3B:
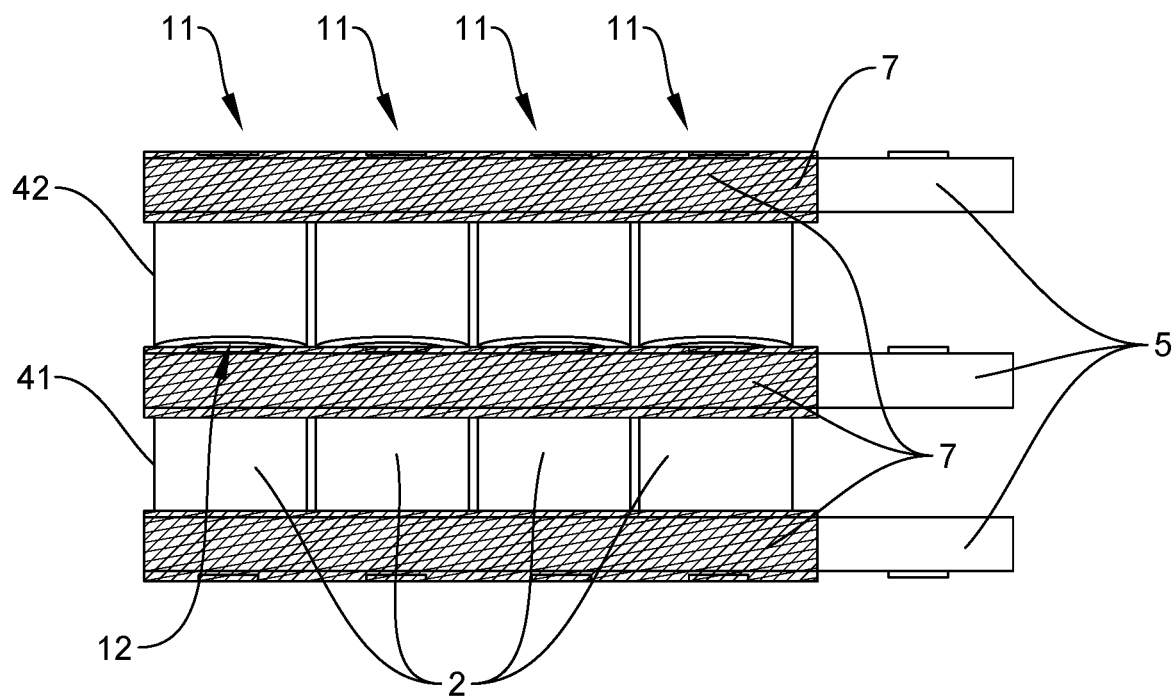

In FIGS. 3a and 3b an energy storage device 1 according to a second preferred embodiment it is shown in a top view (FIG. 3a) and a side view (FIG. 3b). In particular, the energy storage device 1 comprises several busbars 5, preferably three busbars 5 being arranged above each other, such that between two busbars a first row 41 or a second row 42 of capacitors 2 is arranged respectively. In particular, it is provided that several first contact sides 11 of several capacitors 2 are connected to each other and to one of the busbars 5 by the contact element 8 configured as mesh 7. In particular, the energy storage device 1 differs from the energy storage device 1 of the FIG. 1 such that according to the embodiment of the FIGS. 3a and 3b it is provided that both the first contact sides 11 and the second contact sides 12 of the capacitors 2 are connected to the busbar 5 via the contact element 8 in form of the mesh 7. Thus, the busbar 5 extends mainly perpendicular to a plane comprising the first contact side 11 and/or second contact side 12. It is also conceivable that the busbar 5 is arranged slanted relative to the plane comprising the first contact side 11 and/or second contact side 12. Furthermore, it is provided that the first contact side 11 of the capacitor 2 is connected to the mesh 7 in a connection region 15, for example by soldering and/or welding. In particular, the connection regions 15 are part of the first contact side 11 and are distributed stochastically along the first contact side 11. For example, the connection region 15 has a circular shape.

Figure 4:
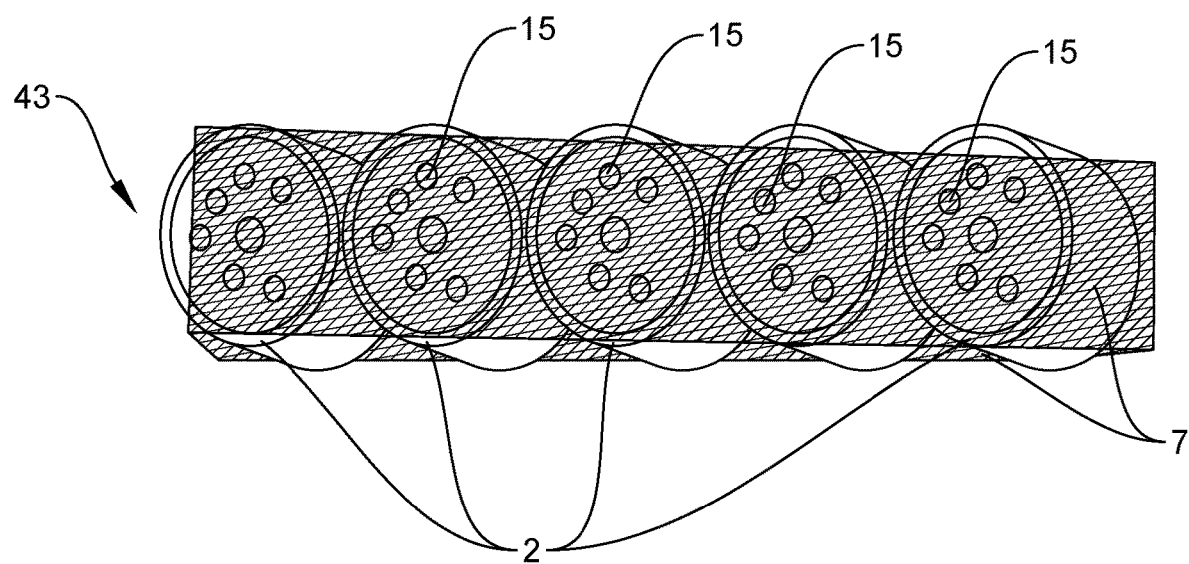

In FIG. 4 an energy storage device 1 according to a third preferred embodiment of the present invention is shown. In particular, the energy storage device 1 comprises several capacitors 2 that are arranged in a third row 43 next to each other. All capacitors 2 being arranged in the third row 43 are connected with each other by a contact element 8 being formed as a mesh 7. In particular, it is provided that the contact element 8 is arranged on first contact sides 11 of the capacitors 2, and a further contact element 8 is arranged on second contact sides 12 being located at the opposite end of the capacitors 2. Preferably, the contact element 8 and the further contact element 8 extend at least partially parallel to each other.

Figure 5:
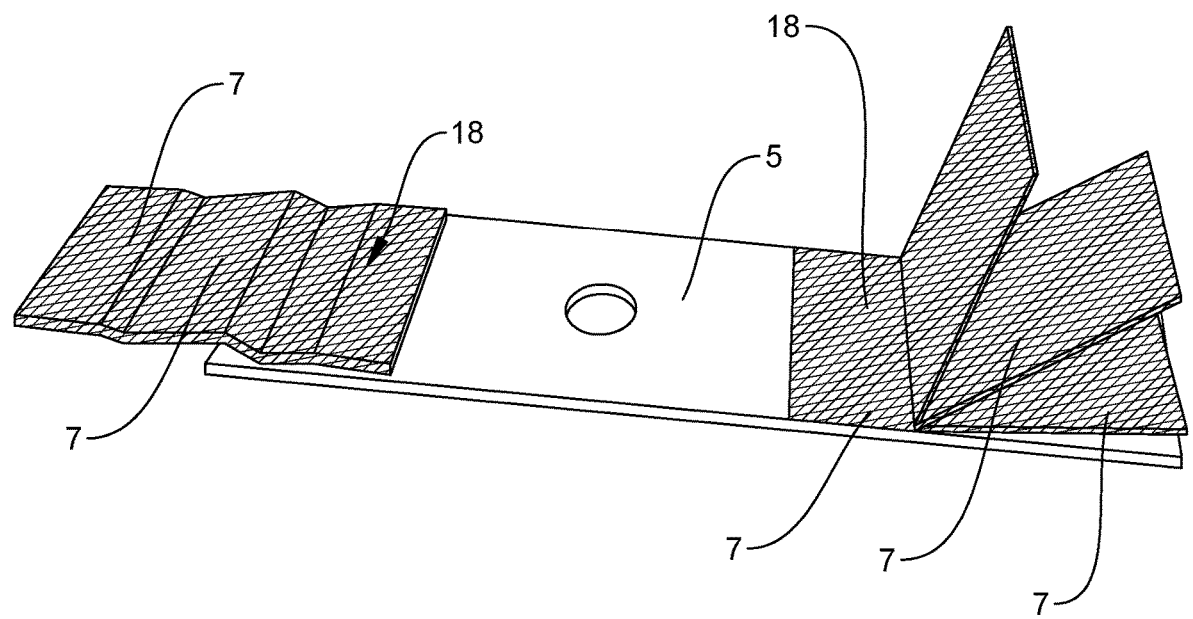

In FIG. 5 a busbar 5 for an energy storage device 1 according to a fourth preferred embodiment of the present invention is shown. In particular, it is provided that several different meshes 7 are connected to the same busbar 5. Preferably, the meshes 7 are connected to the busbar 5 next to or at a region of the busbar 5 having a recess 18. Especially several meshes 7, for example three meshes 7, are connected to the same region, in particular by arranging end sections of the meshes 7 above each other.

REFERENCE LIST 1 energy storage device
2 electrical component
5 busbar
7 mesh
8 contact element
9 interlayer connection
11 first contact side
12 second contact side
15 connection region
18 recess
21 isolation layer
22 further isolation layer
31 first conductive layer
32 second conductive layer
41 first row
42 second row
43 third row
51 first wire
52 second wire
54 open area
55 crossing point
W width
D distance
S stacking direction
A A-A-line
MEP main extension plain
Di diameter

The invention claimed is:

1. An electrical energy storage device (1), comprising at least one electrical component (2) being a capacitor free from insulation, and a busbar (5) for electrical power distribution, wherein at least a first contact side (11) and/or at least a second contact side (12) of the electrical component (2) is connected to the busbar (5) for an electrical connection by a contact element (8), and wherein the contact element (8) is formed at least partially as a mesh (7) characterized in that the contact element (8) is constructed such that the contact element (8) surrounds an arrangement of capacitors and the busbar (5) in the region of an edge of the busbar (5), wherein the contact element is formed as mesh in a bended region, wherein the busbar (5) and the capacitors are located between opposite ends of the bended contact element, wherein the contact element is bow shaped, and
  wherein first contact sides of the capacitors face away from the busbar and the contact element contacts each first contact side, wherein the contact element is adhesively connected to the first contact side by soldering via several connection regions, wherein the connection regions are 4 times smaller than an extension of the first contact side.

2. The electrical energy storage device (1) according to claim 1, where the contact element (8) surrounds the electrical component (2) at least partially and/or is bended.

3. The electrical energy storage device (1) according to claim 1, wherein the mesh (7) is configured as a plain weave-like structure.

4. The electrical energy storage device (1) according to one claim 1, wherein the mesh (7) is made from first wires (51) and/or second wires (52), wherein the first wires (51) extend parallel to each other and the second wires (52) extend parallel to each others, wherein the first wires (51) and the second wires (52) cross each other at crossing points (55), wherein an angle between the first wires (51) and the second wires (52) in the crossing point (55) has a value between 40° to 120°.

5. The electrical energy storage device (1) according to claim 1, wherein the contact element (8) is adhesively connected to the first contact side (11), the second contact side (12) and/or the busbar (5).

6. The electrical energy storage device (1) according to claim 1, wherein the mesh (7) is made from first wires (51) and/or second wires (52) having a thickness between 0.1 and 1 mm.

7. The electrical energy storage device (1) according to claim 1, wherein a width (W) assigned to an open area (54) of the mesh (7) has a value between 0.5 mm and 2.0 mm.

8. The electrical energy storage device (1) according to claim 1, wherein the contact element (8) contacts several first contact sides (11) and/or several second contact sides (12) of different electrical components (2) to the busbar (5).

9. The electrical energy storage device (1) according to claim 1, wherein the complete contact element (8) is formed as mesh (7) and/or a region of the contact element (8) connected to the first contact side (11) and/or to the second contact side (12) is formed as mesh (7).

10. The electrical energy storage device (1) according to claim 1, wherein the busbar (5) is at least partially covered by an isolation layer (21).

11. The electrical energy storage device (1) according to claim 10, wherein the electrical component (2) is directly arranged on the isolation layer (21).

12. The electrical energy storage device (1) of claim 1, wherein the busbar (5) comprises a first conductive layer (31) and a second conductive layer (32), wherein a further isolation layer (22) is arranged between the first conductive layer (31) and the second conductive layer (32).

13. The electrical energy storage device (1) according to claim 1, wherein the mesh (7) is made from copper having a purity that is larger than 95%.

14. The electrical energy storage device (1) according to claim 1, wherein the contact element (8), is at least partially coated with an additional isolation layer.

15. The electrical energy storage device according to claim 1, wherein the contact elements of several first contact sides and several second contact sides of different electrical components are connected to the busbar.

* * * * *